United States Patent [19]

Swirbel et al.

[11] Patent Number: 5,395,740

[45] Date of Patent: Mar. 7, 1995

[54] METHOD FOR FABRICATING ELECTRODE PATTERNS

[75] Inventors: Thomas J. Swirbel, Davie; John K. Arledge, Lauderhill; James L. Davis, Coral Springs, all of Fla.

[73] Assignee: Motorola, Inc., Schaumburg, Ill.

[21] Appl. No.: 10,224

[22] Filed: Jan. 27, 1993

[51] Int. Cl.⁶ .............................. G03F 7/26; G03C 5/16
[52] U.S. Cl. ...................................... 430/315; 430/20; 430/324; 430/328; 430/329; 427/250; 427/259; 156/659.1
[58] Field of Search ............... 430/311, 313, 315, 324, 430/327, 328, 329, 20; 427/164, 250, 255, 259; 156/643, 659.1

[56] References Cited

U.S. PATENT DOCUMENTS

| | | | |
|---|---|---|---|
| 3,982,943 | 9/1976 | Feng et al. | 430/312 |
| 4,004,044 | 1/1977 | Franco et al. | 204/192.32 |
| 4,174,219 | 11/1979 | Andres | 430/321 |
| 4,670,097 | 6/1987 | Abdalla et al. | 156/659.1 |
| 4,827,326 | 5/1989 | Altman | 430/317 |

FOREIGN PATENT DOCUMENTS 53-053342 5/1978 Japan .................................. 430/315

OTHER PUBLICATIONS

IBM Technical Disclosure Bulletin, by Fredericks, et al., titled "Polysulfone Lift-Off Masking Technique" IBM Corp. vol. 20, No. 3, Aug., 1977.
IBM Technical Disclosure Bulletin, by Dalal, et al., titled "Chrome-Copper-Chrome Lift-Off Process", IBM Corp. vol. 20, No. 8, Jan., 1978.

Primary Examiner—Kathleen Duda
Attorney, Agent, or Firm—Dale W. Dorinski

[57] ABSTRACT

A method of forming electrode patterns on a substrate. A transparent substrate (10) is patterned with a photoresist layer (14) on the front side so that portions (18) of the substrate are revealed. A metal oxide layer (12) is deposited on the patterned photoresist layer and the revealed portions of the substrate. The patterned photoresist layer is then exposed to actinic radiation (19) through the back side (25) of the transparent substrate. The photoresist pattern (20) is removed, carrying with it those portions of the metal oxide layer deposited on the photoresist layer, forming an electrode pattern (22) by a lift-off technique.

6 Claims, 2 Drawing Sheets

METHOD FOR FABRICATING ELECTRODE PATTERNS

CROSS REFERENCE TO RELATED APPLICATIONS

This application is related to U.S. Patent application "Method for Fabricating Transparent Electrode,", Ser. No. 08/010,223 by James L. Davis, Thomas J. Swirbel and John K. Arledge, filed Jan. 27, 1993, and both assigned to Motorola, Inc., now abandoned.

TECHNICAL FIELD

The present invention relates, in general, to the fabrication of electrode layers in a thin film device and, more particularly, to fabricating transparent electrode layers for use in electroluminescent displays, such as liquid crystal displays.

BACKGROUND

Liquid crystal displays are generally formed of two panels, each having a transparent electrode pattern. The function of the pattern on the panels is to apply an electrical field across a liquid crystal fluid residing in a gap between the panels, thereby causing a change in the optical properties of the liquid crystal. One or both of the panels is typically transparent in order that a change in the liquid crystal might be viewed by a user. Each panel is connected to a suitable voltage source. The voltage source powers the elements that have been patterned on one or both of the panels in order to provide the display, with the elements of pattern in a shape corresponding to the information that is to be displayed. For example, the pattern may represent the outline of a variety of letters, numbers, or symbols.

The elements in the pattern typically are formed from a material such as indium-tin oxide (ITO). The elements are then connected to the voltage source by a conductive metal bus system. These electrodes are usually prepared by first coating one surface of a substrate by vacuum deposition of the ITO. Portions of the ITO are then selectively removed by etching in order to produce the desired electrode pattern. In order to confine the etching to selected areas, the ITO layer is covered with a photoresist or layer of photopolymerizable material. The photoresist is then polymerized in the desired image by exposure to radiation, such as ultraviolet light. The unpolymerized resist in the unexposed area is then removed by a suitable solvent in order to form windows in the resist. The uncovered areas of the ITO layer are then etched away with appropriate solvents such as acids, in order to create the pattern. The remaining portions of the photoresist layer are then stripped off, leaving the substrate with the desired electrode pattern formed thereon.

While this method of photoetching patterns makes it possible to prepare very complex patterns having very fine lines, aggressive acids are required to etch the ITO. These acids can attack some substrates, such as plastics. Prior art solutions to avoid this problem have included lift-off methods in which a photoresist is applied and imaged directly on the substrate. The metal film is then deposited on the resist and the substrate, and when the resist is stripped away, it takes the unwanted portions of the metal film with it. Conductor resolution is defined solely by the lithography of the resist. One problem with conventional lift-off techniques is that they use aggressive stripping solutions to remove the polymerized resist, which may be harmful to plastic substrates used in flexible displays.

Therefore, a need has continued to exist for a method of producing electrode patterns on a substrate which avoid the problems introduced by known and conventional methods of the art.

SUMMARY OF THE INVENTION

Briefly, according to the invention, there is provided a method of forming electrode patterns on a substrate. A transparent substrate is patterned with a photoresist layer on the front side so that portions of the substrate are revealed. A coating is deposited on the patterned photoresist layer and the revealed portions of the substrate. The patterned photoresist layer is then exposed to ultraviolet light through the back side of the transparent substrate. The photoresist layer is removed, carrying with it those portions of the coating deposited on the photoresist layer, forming an electrode pattern by a lift-off technique.

DETAILED DESCRIPTION OF THE PREFERRED EMBODIMENT

Figure 1:
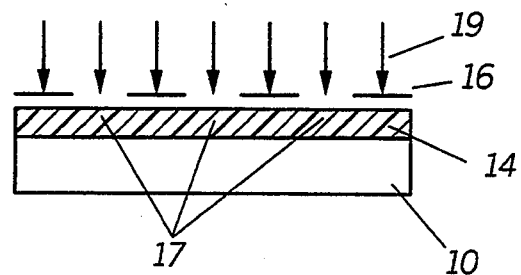
FIGS. 1 through 5 are cross-sectional illustrations that represent steps of the process for fabricating electrode patterns on a transparent substrate in accordance with the invention.

While the specification concludes with claims defining the features of the invention that are regarded as novel, it is believed that the invention will be better understood from a consideration of the following description in conjunction with the drawing figures, in which like reference numerals are carried forward.

Referring now to FIG. 1, a substrate 10 is used as the base or support for the electrodes to be patterned for the liquid crystal display. The substrate 10 is typically a transparent material, such as glass or plastic. If the substrate is plastic, it may be a material such as a polyester, polyethersulfone, polycarbonate, or polyetherimide film. Plastic substrates are particularly preferred for flexible displays. A photoresist layer 14, typically a positive acting resist, is applied to the substrate. A mask 16 is then applied over the photoresist layer 14 in order to selectively cover portions of the photoresist layer. The assembly is then exposed to actinic radiation, typically ultraviolet light 19. The ultraviolet light 19 initiates a chemical reaction in the photoresist layer 14, which causes the exposed portions 17 of the photoresist layer to become depolymerized or broken down, rendering them more soluble in selected chemicals.

Figure 2:
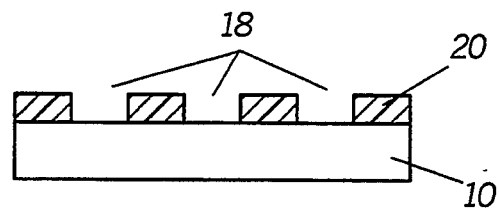

Referring now to FIG. 2, the photoresist layer is developed by conventional means, for example, in solvents or aqueous solutions in order to remove the depolymerized portions 18 of the resist, creating a pattern 20. The unexposed portions comprise the pattern 20, which remains after development of the photoresist layer 14. The pattern 20 now covers only certain areas of the substrate, leaving other portions 18 of the front side of the substrate revealed.

Figure 3:
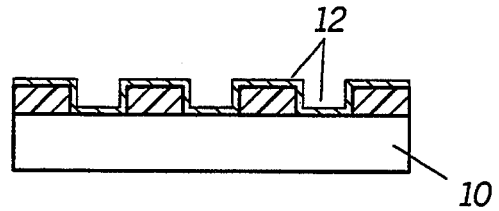

Referring now to FIG. 3, a coating, for example, a metal oxide layer 12, is then deposited on the photoresist pattern and the revealed portions 18 of the substrate 10. Other metal compounds, such as metal nitrides and metal sulfides, may also be used. The layer 12 is very thin as compared to the thickness of the substrate 10 and, for purposes of illustration, is intentionally shown in exaggerated scale in the drawing figures. The metal oxide layer 12 preferably comprises indium-tin oxide (ITO) which may be applied by conventional vacuum deposition processes such as sputtering. In addition, metals such as aluminum, chrome, nickel, tin, indium, zinc, or tantalum may be used singly, or in combination. In the sputtering technique, one or more targets formed from the materials to be deposited, for example, indium and/or tin are bombarded by inert gas ions, for example, Argon, causing the metal atoms to be deposited on the substrate. In order to generate effective sputtering rates, a glow discharge of plasma is required in the sputtering system. Various types of sputtering processes known to those skilled in the art may be used, such as DC magnetron, RF, or bias sputtering. In the present invention, the preferred technique is to provide a reactive sputtering condition with a gas, in this case oxygen, introduced into the vacuum chamber so that an oxide of the target material will be deposited on the substrate. During the sputtering process, the pure metal(s) is converted to metal oxide(s) and deposited directly on the substrate and the photoresist pattern.

Figure 4:
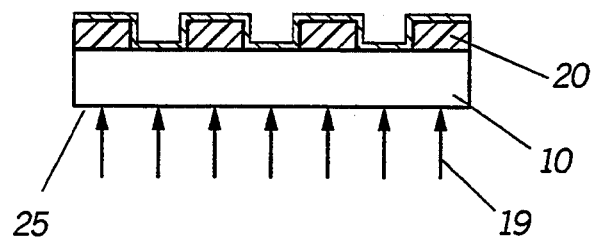
Figure 5:
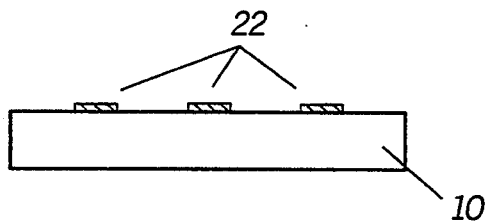
Figure 6:
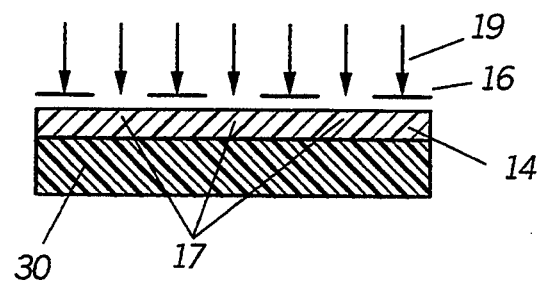
Figure 7:
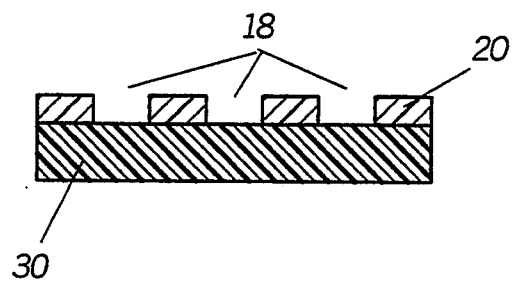
Figure 8:
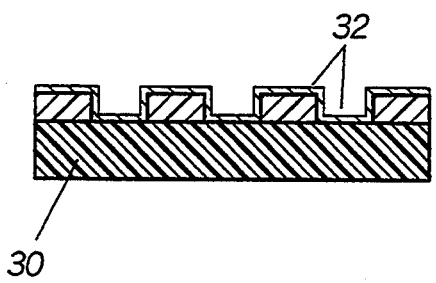
Figure 9:
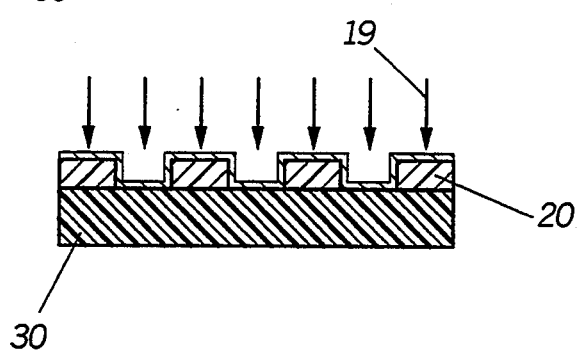
Figure 10:
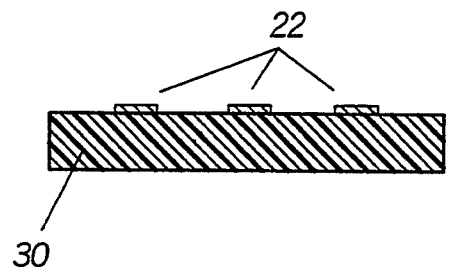

Turning now to FIG. 4, the photoresist pattern 20 is now completely depolymerized by flood exposing it to, for example, ultraviolet light 19. This is easily accomplished in the present invention be transmitting the light through the substrate by exposing it from the back side 25. Since the substrate 10 is transparent, this does not pose a problem. As in the initial exposure step, the light 19 causes a chemical reaction in the resist 20, rendering it more soluble in selected chemicals. This depolymerization allows the resist to be removed in the same solution used for developing, as opposed to the aggressive chemicals typically used for stripping. For example, conventional stripping solutions frequently employ solutions made from butyl acetate, concentrated hydroxides, glycol ethers and/or amines. These chemicals are harmful to the plastics typically used in flexible displays, pose disposal problems, and are environmentally damaging. Concentrated hydroxide strippers can also adversely affect the oxidation state of the metal oxide film, thus changing its conductivity and physical properties. In FIG. 5, when the photoresist pattern 20 is removed or dissolved by the developing solution (typically the same solution that was used for the initial development step), those portions of the metal oxide layer 12 that lie over the photoresist pattern 20 are carried away with the resist, leaving a pattern 22 defined in the metal oxide layer.

As can now be readily understood, the metal oxide layer does not need to be removed by techniques such as etching in strong acids or bases. As shown in FIG. 5, the metal oxide layer is now a discontinuous layer forming the desired electrode pattern 22. This technique also does not require an extra step of removing the resist layer, as in the prior art. Having reviewed the process of the present invention, the reader will now appreciate that high quality, high resolution metal oxide layers, such as indium-tin oxide, can be formed on transparent substrates to provide an electrode pattern. The process of the instant invention solves the problems currently encountered when using lift-off techniques. The use of harsh acids, bases or organic strippers is not required, thus allowing a wider range of materials to be used as substrates.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A method of patterning electrode patterns on a substrate, comprising the steps of:
    a) providing a transparent substrate having a patterned photoresist layer on a front side so that portions of the front side are revealed;
    b) depositing a coating on the patterned photoresist layer and the revealed portions of the front side;
    c) exposing the coated patterned photoresist layer to actinic radiation through a back side of the transparent substrate; and
    d) removing the exposed photoresist layer and those portions of the coating deposited on the photoresist layer to form an electrode pattern by a lift-off technique.

2. The method as described in claim 1, wherein the coating is deposited by sputtering.

3. The method as described in claim 1, wherein the coating is a metal, metal oxide, metal nitride, or metal sulfide.

4. A method of patterning transparent, electrically conductive layers on a substrate, comprising the steps off
    a) providing a transparent substrate having a photoresist layer on a front side;
    b) selectively exposing portions of the photoresist layer to actinic radiation;
    c) developing the selectively exposed photoresist layer to reveal portions of the substrate;
    d) depositing a metal oxide layer on the developed photoresist layer and the revealed portions of the substrate;
    e) after step (d) exposing the photoresist layer to actinic radiation through a back side of the substrate; and
    f) after step (e) removing the photoresist layer to form an electrode pattern by a lift-off technique.

5. The method as described in claim 4, wherein the metal oxide layer is deposited by sputtering.

6. A method of patterning transparent, electrically conductive layers on a substrate, comprising the steps of:
    a) providing a transparent substrate having a front side and a back side, and having a positive photoresist layer on the front side;
    b) selectively exposing portions of the photoresist layer to ultraviolet light;
    c) developing the selectively exposed photoresist layer in a dilute hydroxide solution to reveal portions of the substrate;
    d) sputtering an indium-tin oxide layer on the developed photoresist layer and the revealed portions of the substrate;
    e) after step (d) flood exposing the photoresist layer to ultraviolet light through the back side of the transparent substrate; and
    f) after step (e) removing the photoresist layer with a solution of dilute hydroxide to form an indium-tin oxide electrode pattern by a lift-off technique.

* * * * *

UNITED STATES PATENT AND TRADEMARK OFFICE
CERTIFICATE OF CORRECTION

PATENT NO. : 5,395,740
DATED : March 7, 1995
INVENTOR(S) : Swirbel, et al.

It is certified that error appears in the above-identified patent and that said Letters Patent is hereby corrected as shown below:

In the Drawings: Delete FIGs. 6-10.

Signed and Sealed this

Fourth Day of July, 1995

Attest:

BRUCE LEHMAN

*Attesting Officer*  *Commissioner of Patents and Trademarks*